United States Patent [19]

Nakano et al.

[11] Patent Number: 5,616,952
[45] Date of Patent: Apr. 1, 1997

[54] SEMICONDUCTOR DEVICE WITH STRUCTURE TO DECREASE WIRING CAPACITANCE

[75] Inventors: Takashi Nakano; Yukio Taniji, both of Tokyo, Japan

[73] Assignee: NEC Corporation, Tokyo, Japan

[21] Appl. No.: 638,163

[22] Filed: Apr. 26, 1996

[30] Foreign Application Priority Data

Apr. 27, 1995 [JP] Japan .................................. 7-125678

[51] Int. Cl.$^6$ .................................................. H01L 23/552
[52] U.S. Cl. ........................... 257/659; 257/723; 257/724
[58] Field of Search ................................. 257/659, 660, 257/723, 724

[56] References Cited

U.S. PATENT DOCUMENTS 4,716,466  12/1987  Miida et al. .
5,479,044  12/1995  Narahara et al. ...................... 257/533

OTHER PUBLICATIONS

Peter Centen, "CCD On–Chip Amplifiers: Noise Performance versus MOS Transistor Dimensions", *IEEE Transactions on Electron Devices*, vol. 38, No. 5, May 1991, pp. 1206–1216.

*Primary Examiner*—Mahshid D. Saadat
*Assistant Examiner*—S. V. Clark
*Attorney, Agent, or Firm*—Sughrue, Mion, Zinn, Macpeak & Seas

[57] ABSTRACT

It is the object of the invention to expand a band width of an amplifier by effectively decreasing wiring capacitances of the amplifier formed in a semiconductor chip. The semiconductor chip is implemented in a package, and an output signal of the amplifier (not shown) formed in the semiconductor chip is supplied to the input terminal of an external buffer amplifier. In various signal paths which connect the output amplifier to the buffer amplifier, a signal wire, which connects the output terminal of the output amplifier to an output pad formed in the circumference of the chip, is provided with a shield wire thereunder. The shield wire is supplied with the output signal of the buffer amplifier. Since the phase and the amplitude of the voltage supplied by the buffer amplifier is nearly the same as those of the signal wire, the wiring capacitance between both wires is equivalently zero.

6 Claims, 5 Drawing Sheets

SEMICONDUCTOR DEVICE WITH STRUCTURE TO DECREASE WIRING CAPACITANCE

FIELD OF THE INVENTION

The invention relates to a semiconductor device, especially to the semiconductor device, which effectively reduces a capacitive load of an on-chip output amplifier connected to an external buffer amplifier.

BACKGROUND OF THE INVENTION

In a conventional semiconductor device, in order to derive an output signal from a semiconductor chip and supply to an external circuit on condition that the impedances of both the circuits are well matched, an impedance matching circuit becomes necessary. In most cases, the impedance matching circuit is consisted of several stages of source follower amplifiers fabricated on the on-chip, and in some cases in the external circuit, too. That is to say, the signal is once amplified in the on-chip amplifier and again in the external amplifier. Accordingly, the total length of wiring increases in both the amplifiers, and the capacitive load of the last stage of the on-chip amplifier becomes large. A typical semiconductor device with the aforementioned structure is a solid state image sensor. The solid state image sensor comprises a semiconductor chip, on which a CCD (Coupled Charge Device) and an output amplifier are mounted, a package, which seal up the semiconductor chip, and a buffer amplifier, which is attached to the package and has a role of impedance matching with an external circuit. In order to obtain a fine picture, it is indispensable that the size of a picture element is as small as possible, and the output and buffer amplifiers have wide frequency ranges. Then, it is extremely desirable to decrease the captive load caused by wiring in the output amplifier.

SUMMARY OF THE INVENTION

Accordingly, it is an object of the invention to decrease the wiring capacitance of the output amplifier in the semiconductor chip, expand the band width of the output amplifier and make the high speed operation of the semiconductor device be possible.

It is the further object of the invention to decrease the wiring capacitance in the package portion, expand the band width of the semiconductor chip and make the high speed operation of the semiconductor device be possible.

It is still further object of the invention to decrease the wiring capacitances in both the output amplifier in the semiconductor chip and the package portion, expand the band width of the output amplifier and make the high speed operation of the semiconductor device be possible.

According to the first feature of the invention, a semiconductor device comprises:

an output amplifier mounted on a semiconductor chip and sealed in a package, a buffer amplifier positioned in an outside of the package, an input terminal of which is supplied with an output voltage of the output amplifier, and input and output voltages of which have nearly same phases and amplitudes, a signal wire in the semiconductor chip, which connects the output terminal of the output amplifier to an output pad near a side end of the semiconductor chip, and a shield wire in the semiconductor chip, which is positioned under or over the signal wire and communicates with only the output terminal of the buffer amplifier.

According to the second feature of the invention, a semiconductor device comprises:

an output amplifier mounted on a semiconductor chip and sealed in a package, a buffer amplifier positioned in an outside of the package, an input terminal of which is supplied with an output voltage of the output amplifier, and input and output voltages of which have nearly same phases and amplitudes, signal and feed back wires, which are formed in a side end of the package and respectively connected to the input and output terminals of the buffer amplifier, and a shield wire which is positioned under or over the signal wire in the package, and communicates with only the output terminal of the buffer amplifier.

According to the third feature of the invention, a semiconductor device comprises:

an output amplifier mounted on a semiconductor chip and sealed in a package, a buffer amplifier positioned in an outside of the package, an input terminal of which is supplied with an output voltages of the output amplifier, and input and output voltages of which have nearly same phases and amplitudes, a first signal wire in the semiconductor chip, which connects the output terminal of the output amplifier to an output pad near a side end of the semiconductor chip, a first shield wire in the semiconductor chip, which is positioned under or over the signal wire and communicates with only the output terminal of the buffer amplifier, a second signal wire and a feed back wire, both of which are formed in a side end of the package and respectively connected to the input and output terminals of the buffer amplifier, and a second shield wire which is positioned under or over the second signal wire in the package, and communicates with only the output terminal of the buffer amplifier.

Or again, the margin of the band width is assigned to the reduction of the consumed electric power.

The principle of the invention can be summarized as follows. By forming a shield wire under the signal wire, from which the output signal of the output amplifier is derived, the wiring capacitance between the signal wire and the semiconductor substrate is shielded, and the wiring capacitance is formed between the signal and shield wires. In the invention, the shielding wire is supplied with a voltage which is in phase with the output voltage of the buffer amplifier. In general, the amplifier, in which the input and output voltages are nearly in phase and have nearly the same amplitudes, such as an emitter follower circuit, is used as a buffer amplifier. Accordingly, when the output signal of such a buffer amplifier is applied to the shield wire, the amplitudes and the phases of the signal and shielding wires become nearly equal. In such a situation, the effect of the parasitic wiring capacitance between the two aforementioned wires is negligible.

On the other hand, when a shield wire is formed under the signal wire in the package portion, no wiring capacitance is formed between the signal wire and other wires involving the die pad, except the shield wire. When the shield wire in the package portion is supplied with a voltage which has the same amplitude and phase as those of the signal wire in the terminal portion, the aforementioned wiring capacitance has no effect on the operation of the circuit.

Accordingly, the wiring capacitance of the output portion of the output amplifier is equivalently reduced, and the extension of the band width of the circuit can be achieved.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
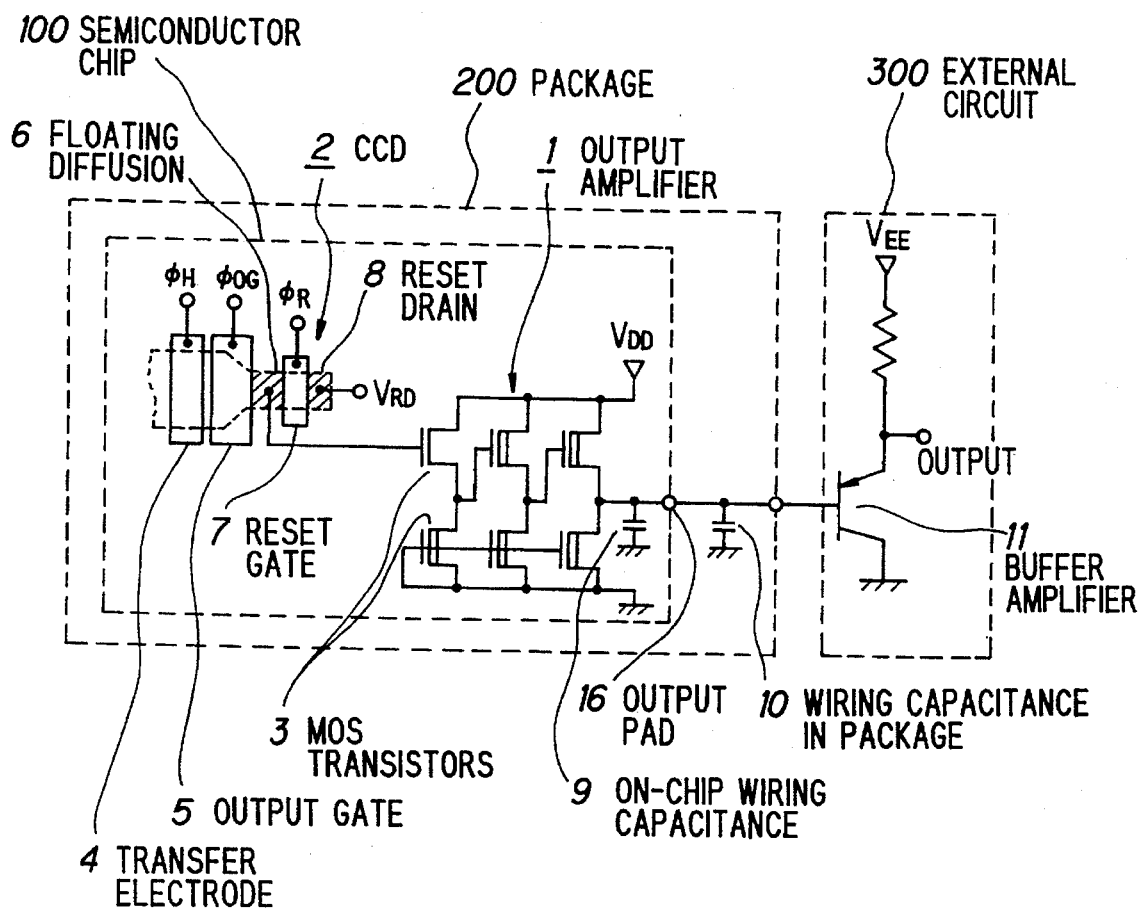
FIG. 1 shows an equivalent circuit of a conventional semiconductor chip.

Before explaining a semiconductor devices in the preferred embodiments according to the invention, the aforementioned conventional semiconductor chip will be explained referring to FIG. 1, FIG. 2A and FIG. 2B.

A conventional solid state image sensor such as a CCD will be explained referring to FIG. 1, as an example of semiconductor devices having output amplifiers. A semiconductor chip 100, in which a solid state image sensor 2 is fabricated, is implemented in a package 200, and an output amplifier 1 in the semiconductor chip 100 is connected to a buffer amplifier 11 in an external circuit 300.

An output amplifier comprises a multi-stage (three stage in FIG. 1) source follower amplifiers, which is consisted of MOS transistors 3s. Moreover, a CCD 2 is fabricated in the semiconductor chip 100. As shown in FIG. 1, the CCD 2 comprises a transfer electrodes 4 on which a transfer clock signal $\Phi_H$ is applied, an output gate 5 on which an output gate voltage $V_{OG}$ is applied, a floating-diffusion 6 which is connected to the first stage driving transistor of the output amplifier 1, a reset-gate 7 on which a reset pulse $\Phi_R$ is applied, and a reset drain 8 on which a reset drain voltage $V_{RD}$, is applied.

In order to achieve a high operation speed by decreasing wiring capacitances, deep attentions are paid to shorten the length of wiring between the floating-diffusion 6 and the output amplifier 1, and those between the stages of the output amplifier 1.

Figure 2A:
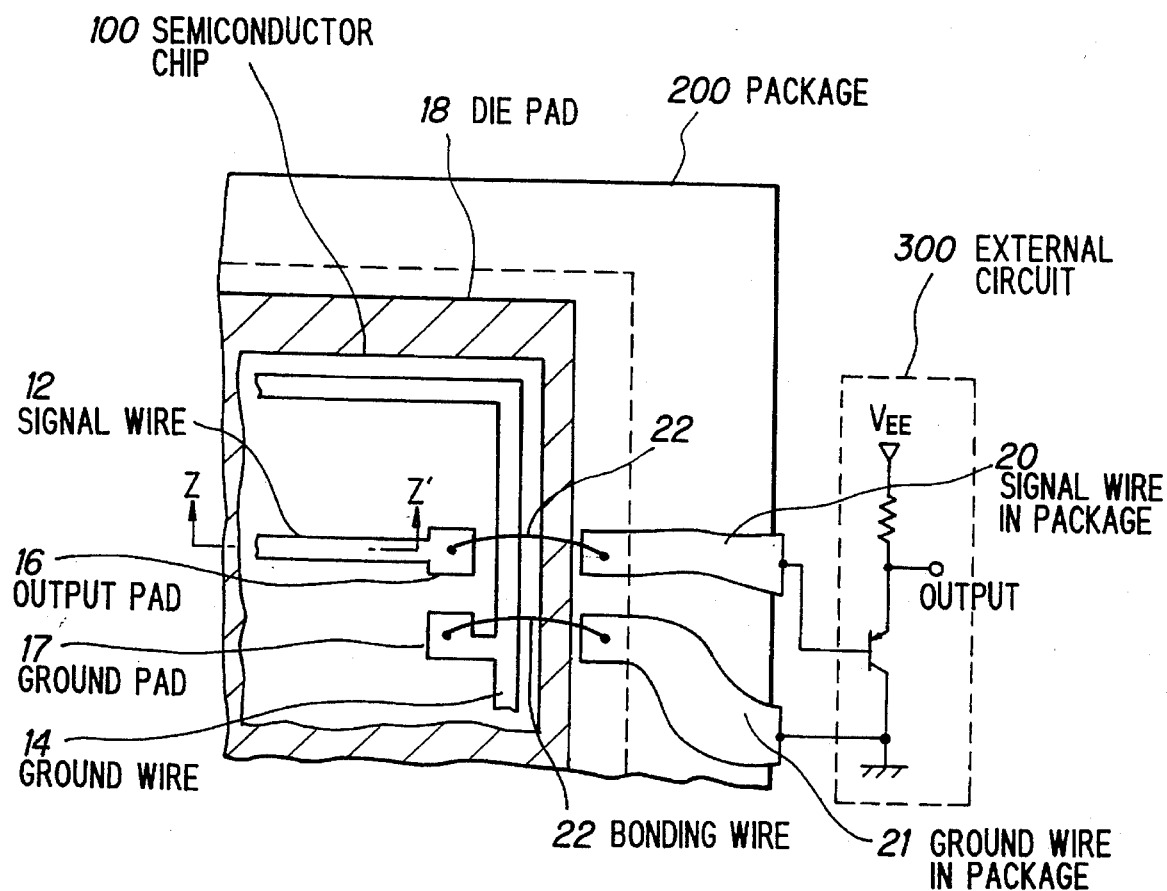
FIGS. 2A to 2B are respectively planar and cross-sectional views of a circumference of a conventional semiconductor chip.
Figure 2B:
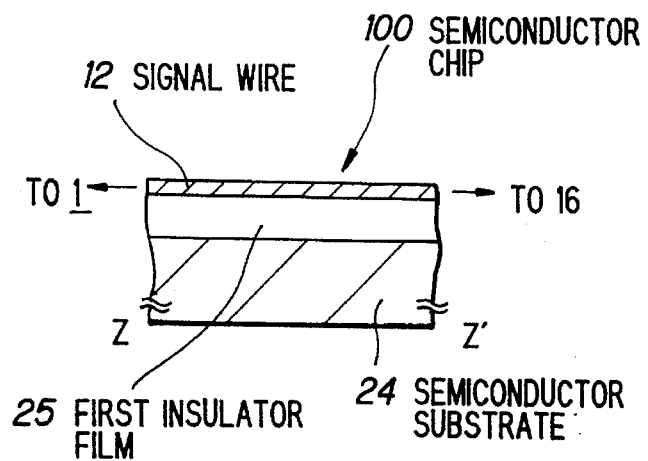

FIG. 2A is a planar view which shows the state of the circumference of the semiconductor chip together with structural elements for connecting the pads of the semiconductor chip to an external circuit, and FIG. 2B is the cross-sectional view in Z-Z' cross-section of the circuit shown in FIG. 2A. As shown in FIG. 2A, a signal wire 12 and a ground wire 14, both of which are derived from the output amplifier 1, are formed on the semiconductor chip 100. In the side end portions of the chip 100, an output pad 16 and a ground pad 17 are respectively formed. In the package 200, a die pad 18 are formed, and the semiconductor chip 100 is mounted thereon. In the circumference of the package 200, a signal wire 20 and a ground wire 21 are formed.

The output pad 16 and the signal wire 20 in the package 200 are connected by a bonding wire 22. Similarly, the ground pad 17 and the ground wire 21 in the package 200 is connected by another bonding wire 22. As shown in FIG. 2B, the signal wire 12 is formed on the semiconductor substrate 24 via an insulator film 25.

As shown in FIG. 2B, on a signal path, which runs from the output amplifier 1 to the buffer amplifier 11, the signal wire 12 faces the semiconductor substrate 24 via the first insulator film 25. Accordingly, as shown in FIG. 1, an on-chip wiring capacitance 9 is formed in a region extending from the output portion of the output amplifier 1 to the output pad 16. Similarly, in the package terminal portion, a wiring capacitance 10 is formed between signal transmitting wires and grounding wires, where the signal transmitting wires mean the bonding were 22, the signal wire 20 in the package portion and etc.

In the solid state image sensor, down-sizing of a picture element is progressed, and spreading of the band width of the output amplifier is earnestly required. However, the improvement of the band width of the conventional output amplifier is limited because of the on-chip wiring capacitance 9 and that or-the package terminal portion 10. When viewed from another standing point, the consumed electric power is increased in order to improve the band width of the output amplifier.

Accordingly, it is the object of the invention to decrease the wiring capacitance in the output portion of the amplifier, expand the band width of the output amplifier and make the high speed operation of the semiconductor device be possible. Or again, the margin of the band width is assigned to the reduction of the consumed electric power.

Next, the embodiments of the invention will be explained referring to the appended drawings.

Figure 3:
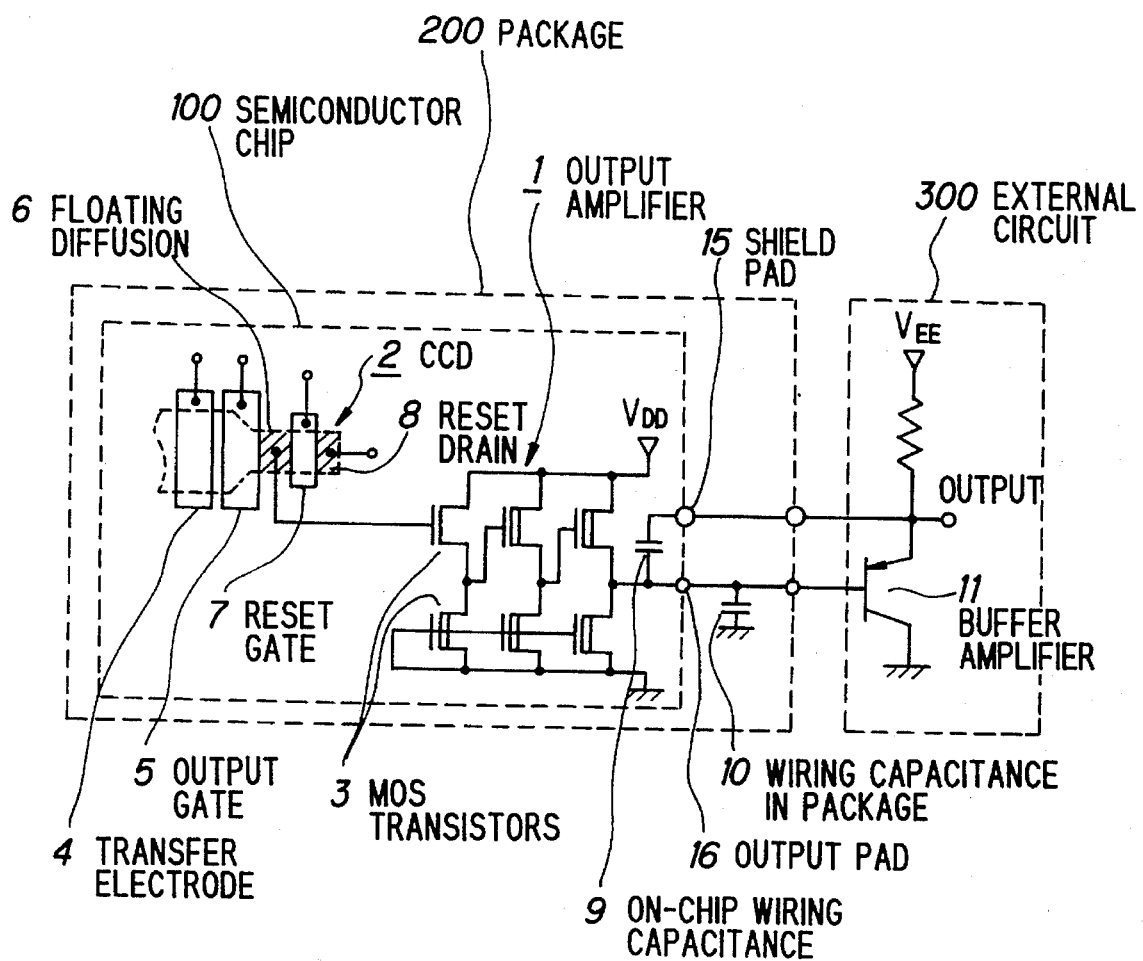
FIG. 3 shows an equivalent circuit of a first preferred embodiment of the invention, FIGS. 4A to 4B respectively show planar and cross-sectional views of a circumference of a semiconductor chip in the first preferred embodiment according to the invention, and FIGS. 5A to 5C respectively show planar and cross-sectional views of a circumference of a semiconductor chip in the second preferred embodiment according to the invention.

FIG. 3 is a equivalent circuit showing the first preferred embodiment. In this drawings, the explanation on the structural elements represented by the same reference numerals as those shown in FIG. 1, will be omitted in order to avoid overlapped explanations. However, it should be noted that the on-chip wiring capacitance 9 is formed between the signal wire on the semiconductor chip and the output terminal of the buffer amplifier 11. Then, the on-chip wiring capacitance becomes equivalently zero.

Figure 4A:
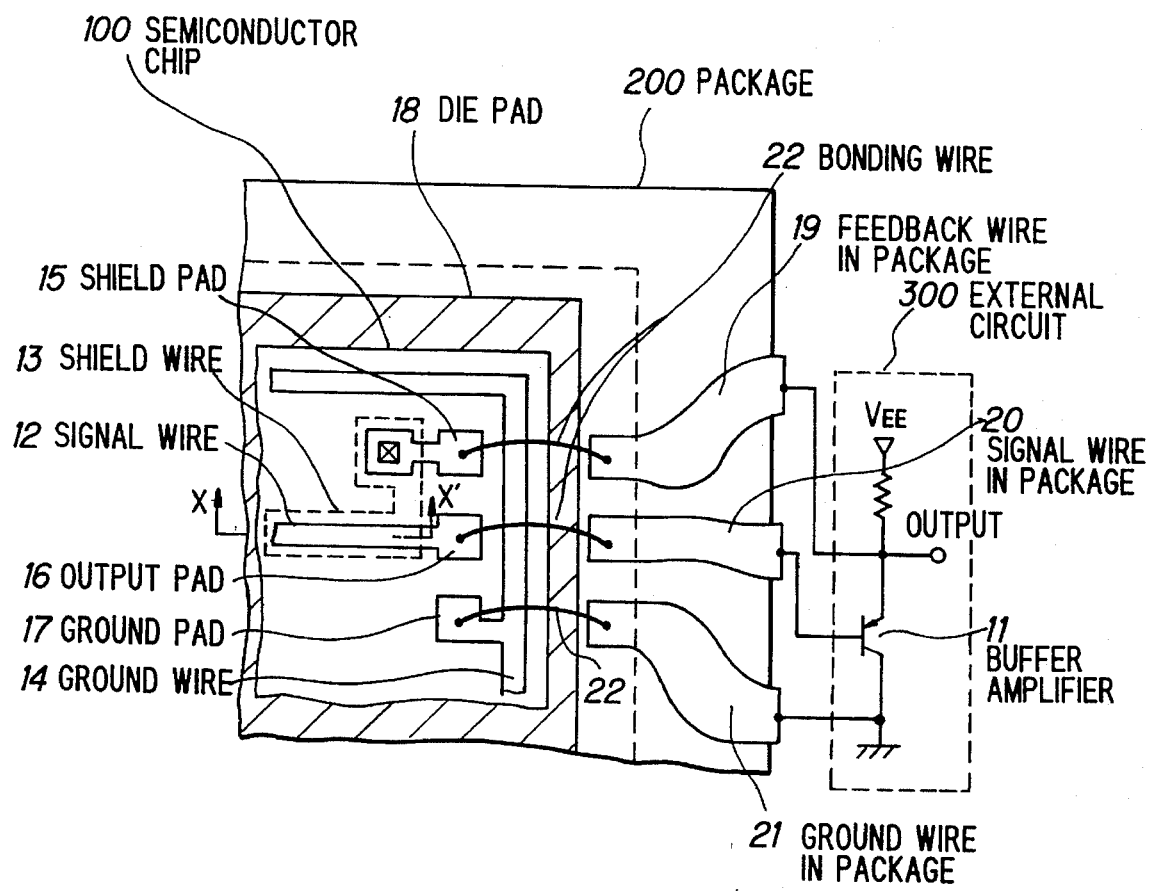
Figure 4B:
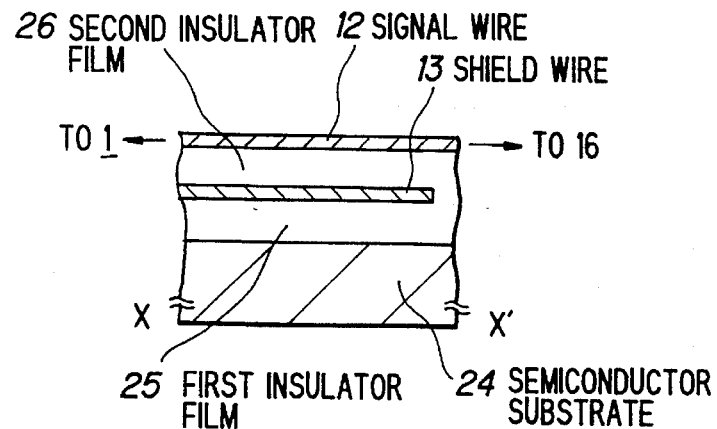

FIG. 4A is a planar view, which shows the situation of the external circumference of the semiconductor chip together with the situation of connections to a external circuit, and FIG. 4B is the cross-sectional view of a structure shown in FIG. 4A in a X—X' cross-section. As shown in FIG. 4A, the semiconductor chip 100 is mounted on the die pad 18 formed on the package 200. The signal wire 12 and the ground wire 14, both of which are derived from the output amplifier, are formed on the semiconductor chip 100, and the shield wire 13 is formed on an under layer of the signal wire 12. That is to say, as shown in FIG. 4B, the shield wire 13 is formed on the semiconductor substrate 24 via the first insulator film 25, and furthermore, the signal wire 12 is formed on the shield wire 13 via the second insulator film 26. The signal wire 12 is connected to the output amplifier 1 in the left side of the drawings. On the other hand, the shield wire 13 is prolonged to a region near the output amplifier, but is never connected any circuit element.

Figure 5A:
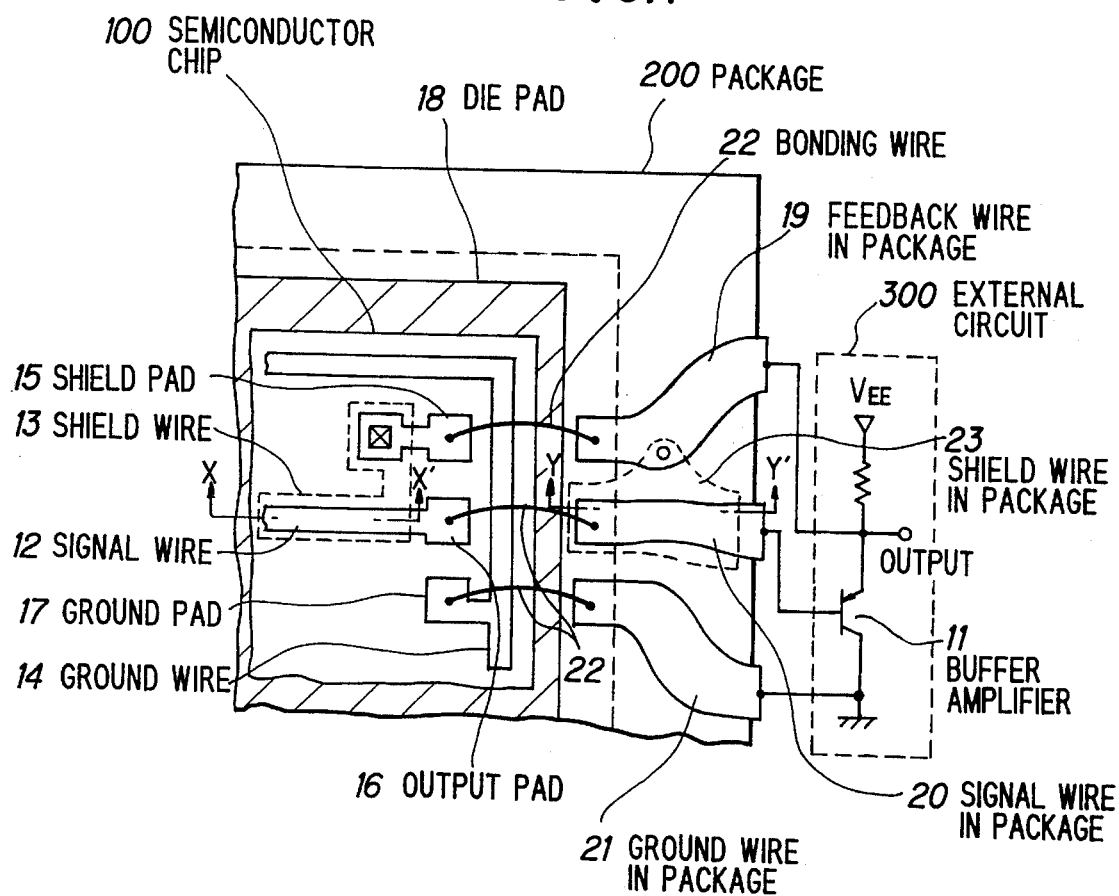
Figure 5B:
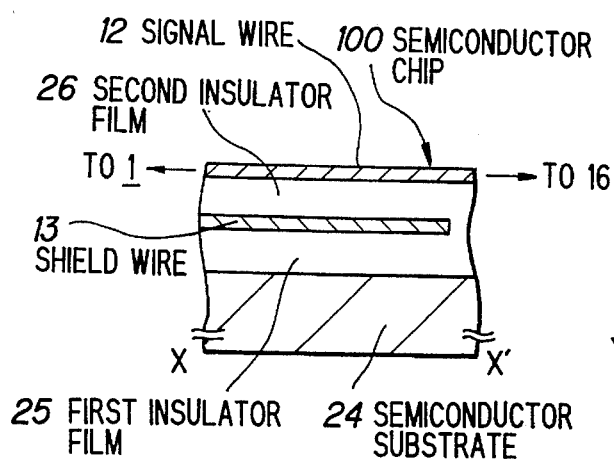
Figure 5C:
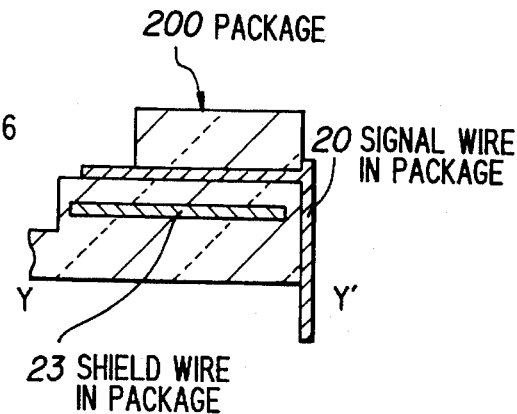

The shield wire 13 is led to an upper layer for wiring via a through hole, and connected to the output terminal of the buffer amplifier 11 via a pad 15 for a shield wiring, a bonding wire 22 and a feed back wire 19 in the package 200. The signal wire 12 is connected to the input terminal of the buffer amplifier 11 via an output pad 16, a bonding wire 22 and a signal wire 20. A ground wire 14 is connected to the ground wire 21 in the package 200 via the ground pad 17 and a bonding wire FIG. 5A is a planar view, which shows the state of the external circumference of the semiconductor chip according to the second preferred invention, together with the state of the connections to an external circuit. FIG. 5B and FIG. 5C are the cross-sectional views of the structure shown in FIG. 5A, which are respectively viewed in X-X' and Y-Y' cross-sections. In FIGS. 5A to 5C, the structural elements which correspond to those shown in FIGS. 4A to 4B are denoted by the same reference numerals. In this embodiment, the shield wire 13 is formed in the semiconductor chip 100. On the other hand, in the package 200, the shield wire 23 is formed on a layer under the signal wire 20. The shield wire 23 in the package 200 is connected to the feed back wire 19, which is connected to the output terminal of the buffer amplifier 11, via a through hole.

In the semiconductor device thus constructed, the wiring capacitance is formed only between the signal wire 20 in the package portion 200 and the shield wire 23 in the same. The wiring capacitance is not formed between signal wire 20 and the ground, and this is an essential difference between the structures shown in FIGS. 5A to 5C and that shown in FIGS. 4A to 5B. Accordingly, in the second preferred embodiment, not only the wiring capacitance of the on-chip portion, but also that of the package portion effectively become zero, and thereby the bandwidth of the output amplifier can be further extended.

In the aforementioned second embodiment, the wiring capacitances are formed between the output terminal of buffer amplifier and both the on-chip and package portions. However, there is another way in which the wiring capacitance is formed between the on-chip portion and the ground as in the conventional technology, and the wiring capacitance is formed between the output terminal of the buffer amplifier and the shield wire in the package portion. As a matter of face, by so constructing the circuit that the wiring capacitance is formed between the signal wire on the package portion and the output terminal of the buffer amplifier, the width of the 3dB down frequency range is increased up to 114 MHz as compared with 94MHz, that of a conventional circuit shown in FIG. 1. Although the invention is effectively applied to the semiconductor device used in a solid state image sensor, a field of application is never restricted to the image sensor, and can be applied an amplifier in which a output signal is amplified by an external buffer amplifier.

In the above descriptions, the way of decreasing the wiring capacitance between the signal wire and the ground, in other words the semiconductor substrate, has been investigated. However, since the semiconductor device according to the invention has the wide field of application, one may be confronted with a case, where other wires or semiconductor layers run over the signal wire. Even in such a case, the difficulty can be overcome by forming a shield wire over the signal wire.

As mentioned in the above, according to the invention, since the captive load of the last stage of the on-chip output amplifier can be effectively decreased, the higher frequency limit of the frequency range of the output amplifier can be increased. Otherwise, if the frequency range of the output amplifier has a margin, one can make a choice of saving consumption of electric power corresponding to the margin of the frequency band.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device, comprising:

an output amplifier mounted on a semiconductor chip and sealed in a package, a buffer amplifier positioned in an outside of said package, an input terminal of which is supplied with an output voltage of said output amplifier, and input and output voltages of which have nearly same phases and amplitudes, a signal wire in said semiconductor chip, which connects said output terminal of said output amplifier to an output pad near a side end of said semiconductor chip, and a shield wire in said semiconductor chip, which is positioned under or over said signal wire and communicates with only said output terminal of said buffer amplifier.

2. A semiconductor device comprising:

an output amplifier mounted on a semiconductor chip and sealed in a package, a buffer amplifier positioned in an outside of said package, an input terminal of which is supplied with an output voltage of said output amplifier, and input and output voltages of which have nearly same phases and amplitudes, signal and feed back wires, which are formed in a side end of said package and respectively connected to said input and output terminals of said buffer amplifier, and a shield wire which is positioned under or over said signal wire in said package, and communicates with only said output terminal of said buffer amplifier.

3. A semiconductor device comprising:

an output amplifier mounted on a semiconductor chip and sealed in a package, a buffer amplifier positioned in an outside of said package, an input terminal of which is supplied with an output voltages of said output amplifier, and input and output voltages of which have nearly same phases and amplitudes, a first signal wire in said semiconductor chip, which connects said output terminal of said output amplifier to an output pad near a side end of said semiconductor chip, a first shield wire in said semiconductor chip, which is positioned under or over said signal wire and communicates with only said output terminal of said buffer amplifier, a second signal wire and a feed back wire, both of which are formed in a side end of said package and respectively connected to said input and output terminals of said buffer amplifier, a second shield wire which is positioned under or over said second signal wire in said package, and communicates with only said output terminal of said buffer amplifier.

4. A semiconductor device, comprising:

a semiconductor chip mounted in a package, and having an output amplifier therein;

a buffer amplifier for buffering an output signal of said output amplifier, said buffer amplifier being an external circuit for said semiconductor chip; and a shield interconnection formed between a signal interconnection for connecting an output terminal of said output amplifier to a signal pad of said semiconductor chip and a member having a potential different from a potential of said output terminal;

wherein said shield interconnection is connected to an output terminal of said buffer amplifier, said output terminal of said buffer amplifier having the same phase as said output terminal of said output amplifier.

5. The semiconductor device as defined in claim 4, wherein:

said shield interconnection is positioned under said signal interconnection not to be connected to any other circuit in said semiconductor chip.

6. The semiconductor device as defined in claim 4, wherein:

said shield and signal interconnections are surrounded by a ground interconnection.

* * * * *